United States Patent
Jeong et al.

(10) Patent No.: US 7,786,972 B2
(45) Date of Patent: Aug. 31, 2010

(54) SHIFT REGISTER AND ORGANIC LIGHT EMITTING DISPLAY USING THE SAME

(75) Inventors: Seon-I Jeong, Suwon-si (KR); Jin-tae Jeong, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 219 days.

(21) Appl. No.: 11/826,103

(22) Filed: Jul. 12, 2007

(65) Prior Publication Data

US 2008/0062097 A1 Mar. 13, 2008

(30) Foreign Application Priority Data

Sep. 12, 2006 (KR) .................. 10-2006-0088092

(51) Int. Cl.
*G09G 3/36* (2006.01)
(52) U.S. Cl. .................. 345/100; 345/84; 345/204; 377/64
(58) Field of Classification Search ............. 345/30–55, 345/59, 82, 204–207, 100; 377/64–81
See application file for complete search history.

(56) References Cited

U.S. PATENT DOCUMENTS 7,239,179 B2  7/2007  Jinta et al.

| | | | |
|---|---|---|---|
| 2004/0227718 A1* | 11/2004 | Park ........................... | 345/100 |
| 2005/0008114 A1 | 1/2005 | Moon | |
| 2005/0212746 A1 | 9/2005 | Iwasaki et al. | |
| 2006/0092148 A1* | 5/2006 | Ozawa et al. ............... | 345/204 |

FOREIGN PATENT DOCUMENTS

| | | |
|---|---|---|
| JP | 2003-346492 | 12/2003 |
| JP | 2003-346492 A | 12/2003 |
| JP | 2006-050288 | 2/2006 |
| JP | 2006-050288 A | 2/2006 |
| KR | 10-2005-0006624 A | 1/2005 |
| KR | 10-2005-0065816 A | 6/2005 |

* cited by examiner

*Primary Examiner*—Henry N Tran
*Assistant Examiner*—Christopher E Leiby
(74) *Attorney, Agent, or Firm*—Lee & Morse, P.C.

(57) ABSTRACT

A shift register, including first through third output nodes and first through third input lines for first through third clock signals, a fourth input line adapted to supply a start pulse or an output signal, a voltage level controller coupled between the second and fourth input lines, the voltage level controller being adapted to control voltage levels of the first and second output nodes, a first transistor coupled between a first power supply and the third output node, the third output node being an output node of the stage, a second transistor coupled between the third output node and the third input line, and a third transistor coupled between the first output node and a second power supply.

18 Claims, 4 Drawing Sheets

SHIFT REGISTER AND ORGANIC LIGHT EMITTING DISPLAY USING THE SAME

BACKGROUND OF THE INVENTION

1. Field of the Invention

Embodiments of the present invention relate to a shift register and an organic light emitting display using the same. More particularly, embodiments of the present invention relate to a shift register for a driving circuit for driving a pixel of the organic light emitting display.

2. Description of the Related Art

Generally, a flat panel display device such an organic light emitting display may include a pixel array in a matrix pattern arranged at intersections of data lines and scan lines. The scan lines may constitute horizontal lines (row lines) of a pixel array portion, and may be selected by the shift register and receive a predetermined scan signal.

FIG. 1 illustrates a block diagram of a configuration of a general shift register.

With reference to FIG. 1, the general shift register may include multiple stages ST1 to STn, which may be coupled to a start pulse SP input line. The multiple stages ST1 to STn may sequentially shift a start pulse SP or an output signal of a previous stage to generate output signals SS1 to SSn corresponding to clock signals supplied from input lines of a clock signal (not shown). The output signals SS1 to SSn generated by the respective stages ST1 to STn may be provided to a pixel array.

The shift register may be included in the scan driver for driving the scan lines. The scan driver may be mounted in a chip-type configuration after the pixel array is formed, or the scan drive may be formed with the pixel array during a process of forming a pixel array on a substrate.

Therefore, there is a need for a method to simply fabricate the pixel array and the scan driver in order to improve an efficiency of a manufacturing process.

Further, by constructing a shift register using a relatively small number of elements, there is a need for a simple design of the shift register combined with a reduction of dead space.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention is therefore directed to a shift register and an organic light emitting display using the same, which substantially overcome one or more of the problems due to the limitations and disadvantages of the related art.

It is therefore a feature of an embodiment of the invention to provide a shift register which is easy to design.

It is therefore another feature of an embodiment of the invention to provide a shift register which has reduced dead space.

It is therefore another feature of an embodiment of the invention to provide a shift register which has improved manufacturing efficiency by constructing the shift register using a relatively small number of elements.

At least one and the above and other features and advantages of the present invention may be realized by providing a shift register which may include multiple stages, each stage including first, second, and third output nodes, first, second, and third input lines adapted to supply first, second and third clock signals, a fourth input line adapted to supply a start pulse or an output signal of a previous stage, a voltage level controller coupled between the second and fourth input lines, the voltage level controller being adapted to control voltage levels of the first and second output nodes according to the start pulse or the output signal of the previous stage, a first transistor coupled between a first power supply and the third output node, the third output node being an output node of the stage, the first transistor including a gate electrode coupled to the first output node, a second transistor coupled between the third output node and the third input line, the second transistor including a gate electrode coupled to the second output node, and a third transistor coupled between the first output node and a second power supply, the third transistor including a gate electrode coupled to the first input line.

The voltage level controller may include a fourth transistor coupled between the fourth input line and the second output node, the fourth transistor including a gate electrode coupled to the second input line, a fifth transistor coupled between the first power supply and the first output node, the fifth transistor including a gate electrode coupled to the fourth input line, and a sixth transistor coupled between the first power supply and the first output node, the sixth transistor including a gate electrode coupled to the second output node. The fourth, fifth, and sixth transistors may be P-type transistors. The voltage level controller may be adapted to control a voltage level of the first output node according to the start pulse or the output signal of the previous stage and a voltage level of the second output node. The first, second, and third transistors may be P-type transistors. The first, second, and third clock signals may have a waveform a phase of which is sequentially delayed. The shift register may also include a first capacitor coupled between the second output node and the third output node.

At least one and the above and other features and advantages of the present invention may be realized by providing an organic light emitting display which may include a pixel portion including multiple pixels electrically coupled to scan lines and data lines, a scan driver including a shift register for sequentially applying a scan signal to the scan lines, and a data driver for applying a data signal to the data lines, where the shift register may include multiple stages coupled to a start pulse input line, each of the stages including first, second, and third output nodes, first, second, and third input lines adapted to supply first, second and third clock signals, a fourth input line adapted to supply a start pulse or an output signal of a previous stage, a voltage level controller coupled between the second and fourth input lines, the voltage level controller being adapted to control voltage levels of the first and second output nodes according to the start pulse or the output signal of the previous stage, a first transistor coupled between a first power supply and the third output node, the third output node being an output node of the stage, the first transistor including a gate electrode coupled to the first output node, a second transistor coupled between the third output node and the third input line, the second transistor including a gate electrode coupled to the second output node, and a third transistor coupled between the first output node and a second power supply, the third transistor including a gate electrode coupled to the first input line.

The voltage level controller may include a fourth transistor coupled between the fourth input line and the second output node, the fourth transistor including a gate electrode coupled to the second input line, a fifth transistor coupled between the first power supply and the first output node, the fifth transistor including a gate electrode coupled to the fourth input line, and a sixth transistor coupled between the first power supply and the first output node, the sixth transistor including a gate electrode coupled to the second output node. The fourth, fifth, and sixth transistors may be P-type transistors. The voltage level controller may be adapted to control a voltage level of the first output node according to the start pulse or the output signal of the previous stage and a voltage level of the second output node. The first, second, and third transistors may be P-type transistors. The first, second, and third clock signals may each have a waveform a phase of which is sequentially delayed. The organic light emitting display may further include a first capacitor coupled between the second output node and the third output node. The organic light emitting display may further include a second capacitor coupled between the first power supply and the first output node.

At least one and the above and other features and advantages of the present invention may be realized by providing a shift register stage which may include first, second, and third output nodes, first, second, and third input lines adapted to supply first, second and third clock signals, a fourth input line adapted to supply a start pulse or an output signal of a previous stage, a voltage level controller coupled between the second and fourth input lines, the voltage level controller being adapted to control voltage levels of the first and second output nodes according to the start pulse or the output signal of the previous stage, a first transistor coupled between a first power supply and the third output node, the third output node being an output node of the stage, the first transistor including a gate electrode coupled to the first output node, a second transistor coupled between the third output node and the third input line, the second transistor including a gate electrode coupled to the second output node, and a third transistor coupled between the first output node and a second power supply, the third transistor including a gate electrode coupled to the first input line.

BRIEF DESCRIPTION OF THE DRAWINGS

The above and other features and advantages of embodiments of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0088092, filed on Sep. 12, 2006, in the Korean Intellectual Property Office, and entitled: "Shift Register and Organic Light Emitting Display Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

Hereinafter, preferred embodiments of the present invention will be described with reference to the accompanying drawings. Here, when one element is coupled to another element, one element may be not only be directly coupled to another element but may also be indirectly coupled to another element via another element. Further, irrelevant elements are omitted for clarity.

A shift register according to embodiments of the present invention may promote easy design of the shift register, reduce dead space, and improve efficiency of a manufacturing process by constructing the shift register using a relatively small number of elements.

Further, the manufacturing process may be simplified by designing the transistors included in each stage to have the same conductive type.

In particular, by applying a scan driver having a shift register constructed from transistors having the same conductive type to an organic light emitting display including a pixel array formed of P-type transistors, the shift register may be formed simultaneously with the pixel array without increasing the number of processing steps. Accordingly, a manufacturing process of the display device may be simplified to result in enhanced efficiency.

Figure 1:
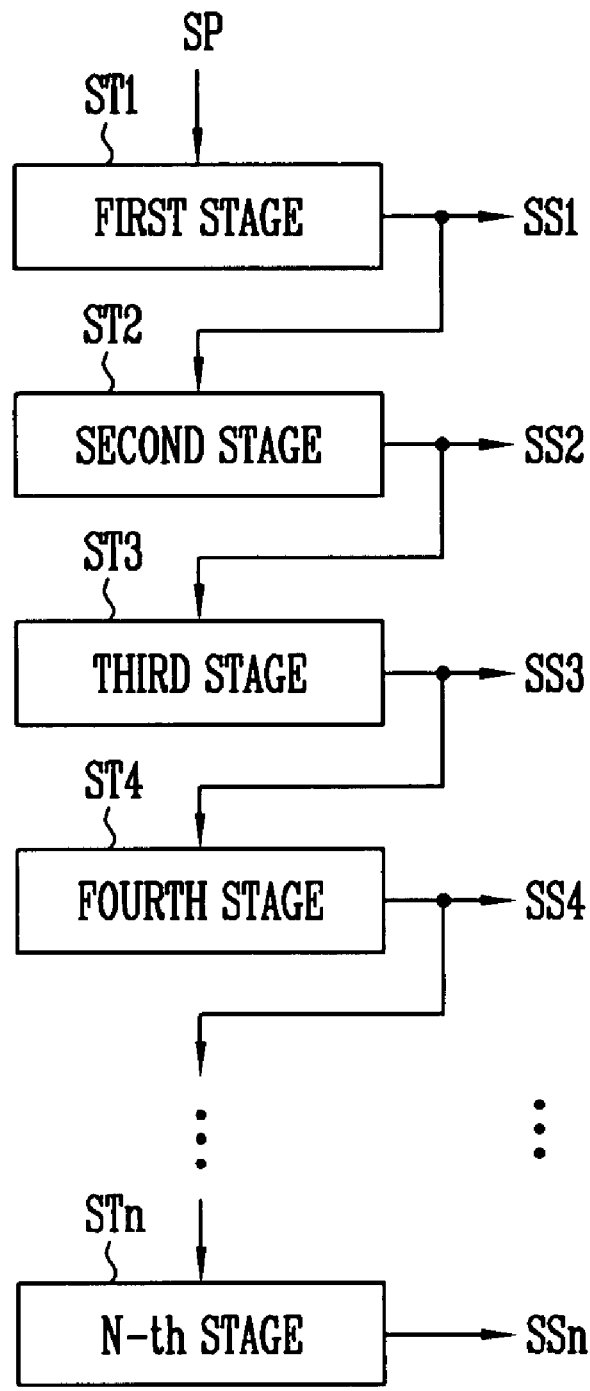
FIG. 1 illustrates a block diagram of a configuration of a general shift register.
Figure 2:
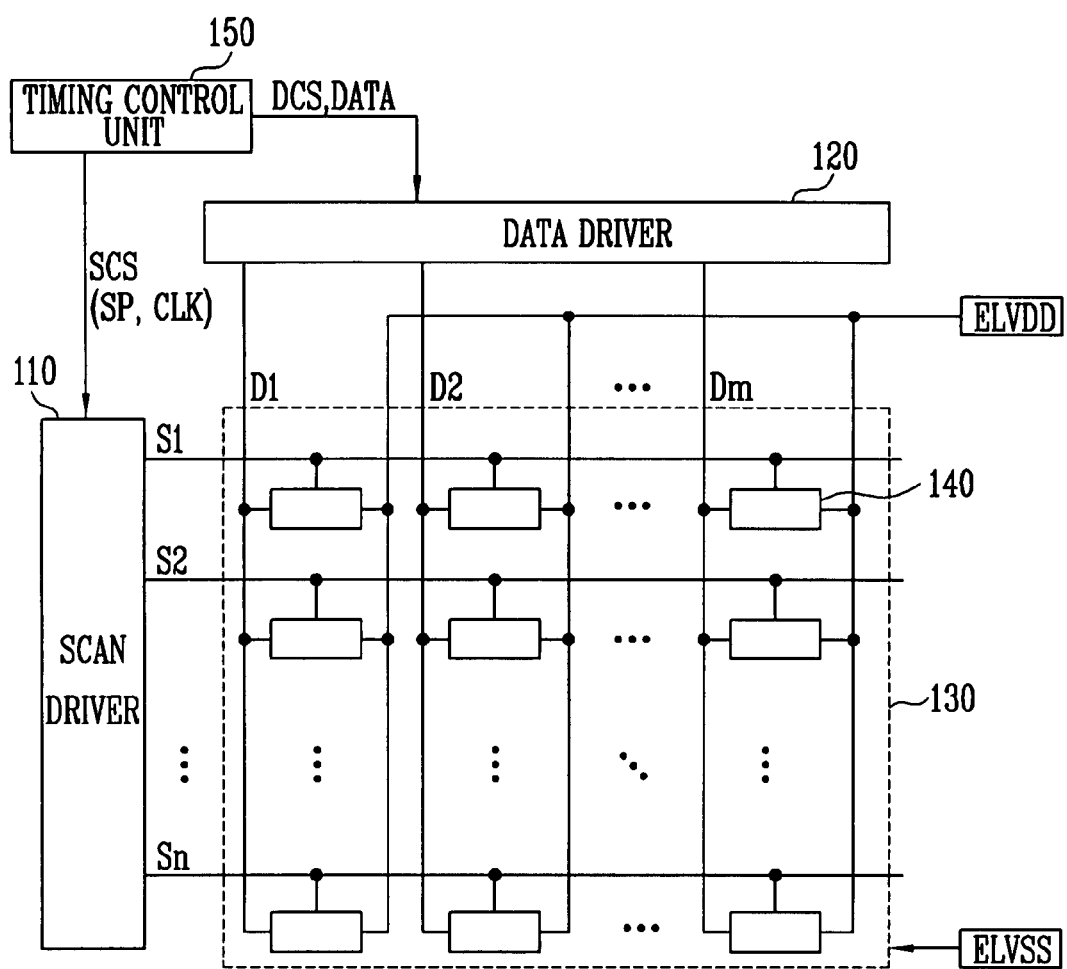
FIG. 2 illustrates a block diagram of a construction of an organic light emitting display according to an embodiment of the present invention.

FIG. 2 illustrates a block diagram of a construction of an organic light emitting display according to an embodiment of the present invention. The organic light emitting display may include a pixel portion 130 including pixels 140 formed in areas divided by scan lines S1 to Sn and data lines D1 to Dm, a scan driver 110 for driving the scan lines S1 to Sn, a data driver 120 for driving the data lines D1 to Dm, and a timing control unit 150 for controlling the scan driver 110 and the data driver 120.

The scan driver 110 may receive scan control signals SCSs, including a start pulse SP and a clock signal CLK, from the timing control unit 150 to generate scan signals, and may provide the scan signals to the scan lines S1 to Sn, respectively. The scan driver 110 may include a shift register, which may sequentially generate the scan signals corresponding to the start pulse SP and the clock signal CLK, and may provide it to the scan lines S1 to Sn.

The data driver 120 may receive a data control signal DCS and data DATA from the timing control unit 150, and may generate data signals. Data signals may be provided to the data lines D1 to Dm in synchronization with the scan signals.

The timing control unit 150 may generate the scan control signals SCSs and the data control signal DCS according to externally supplied synchronous signals. The scan control signals SCSs generated by the timing control unit 150 may be provided to the scan driver 110, and the data control signal DCS generated by the timing control unit 150 may be provided to the data driver 120. Furthermore, the timing control unit 150 may provide externally supplied data DATA to the data driver 120.

The pixel portion 130 may include multiple pixels 140, which may be electrically coupled to the scan lines S1 to Sn and the data lines D1 to Dm. Each of the pixels 140 may receive a voltage of a first pixel power supply ELVDD and a voltage of a second pixel power supply ELVSS from an exterior, and may receive a scan signal and a data signal from the scan driver 110 and the data driver 120, respectively. When each of the pixels 140 receives the voltage of a first pixel power supply ELVDD, the voltage of a second pixel power supply ELVSS, the scan signal, and the data signal, one of the pixels 140 may be selected by the scan signal and may generate light corresponding to the data signal. To do this, each pixel 140 may include at least one organic light emitting diode (OLED). When the pixel 140 is an active matrix type, the pixel 140 may further include an active device, e.g., a P-type transistor.

Figure 3:
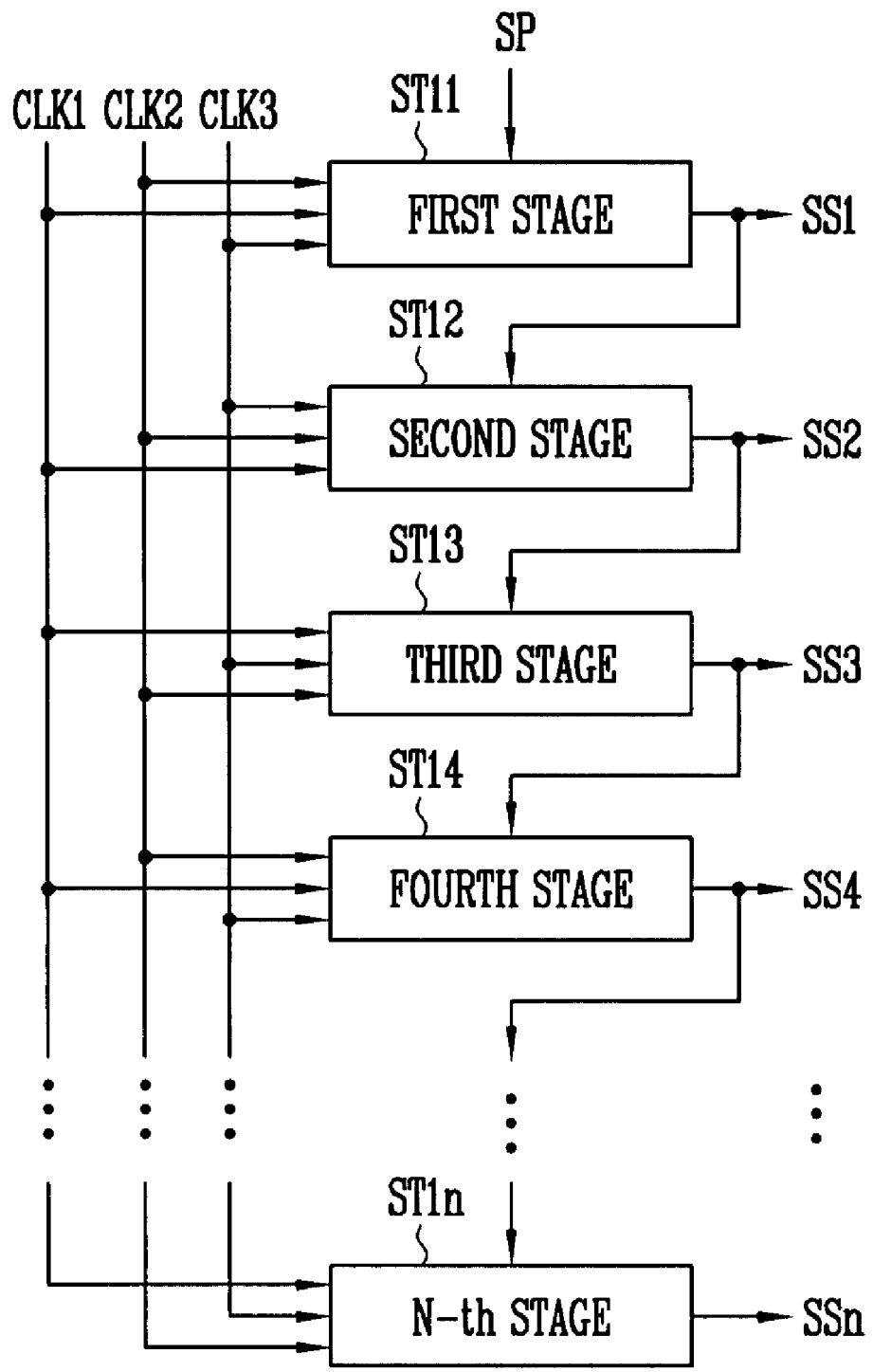
FIG. 3 illustrates a block diagram of an example of a shift register included in the scan driver shown in FIG. 2.

FIG. 3 illustrates a block diagram of an example of a shift register included in the scan driver illustrated in FIG. 2.

With reference to FIG. 3, the shift register may include multiple stages ST11 to ST1n, which may be dependently coupled to a start pulse SP input line and three clock signal CLK1 to CLK3 supply lines. Here, the three clock signals CLK1 to CLK3 may be supplied in such a manner that phases thereof are sequentially delayed.

The first stage ST11 may delay a phase of the start pulse SP supplied thereto by one clock period, and may output the phase-delayed start pulse in response to first to third clock signals CLK1 to CLK3.

Each of the second to n-th stages ST12 to ST1n may delay a phase of an output signal SS1, SS2 . . . of a previous stage supplied to thereto by one clock period, and may output the phase-delayed output signal in response to the first to third clock signals CLK1 to CLK3.

By the aforementioned operations, the stages ST11 to ST1n may sequentially generate phase-delayed output signals SS1 to SSn, and may sequentially provide the generated output signals SS1 to SSn to respective scan lines.

The shift register illustrated in FIG. 3 is driven by the three sequentially phase-delayed clock signals CLK1 to CLK3. However, in practice, the shift register may be driven by four sequentially phase-delayed clock signals. In this case, each stage ST may receive only three of the four clock signals, and generate an output signal SS corresponding thereto.

For example, a first stage ST11 may receive first, third, and fourth clock signals. A second stage ST12 may receive second, fourth, and first clock signals, which may be obtained by sequentially delaying phases of the first, third, and fourth clock signals, respectively. In the same manner, third to n-th stages ST13 to ST1n may sequentially receive three phase-delayed clock signals.

Figure 4:
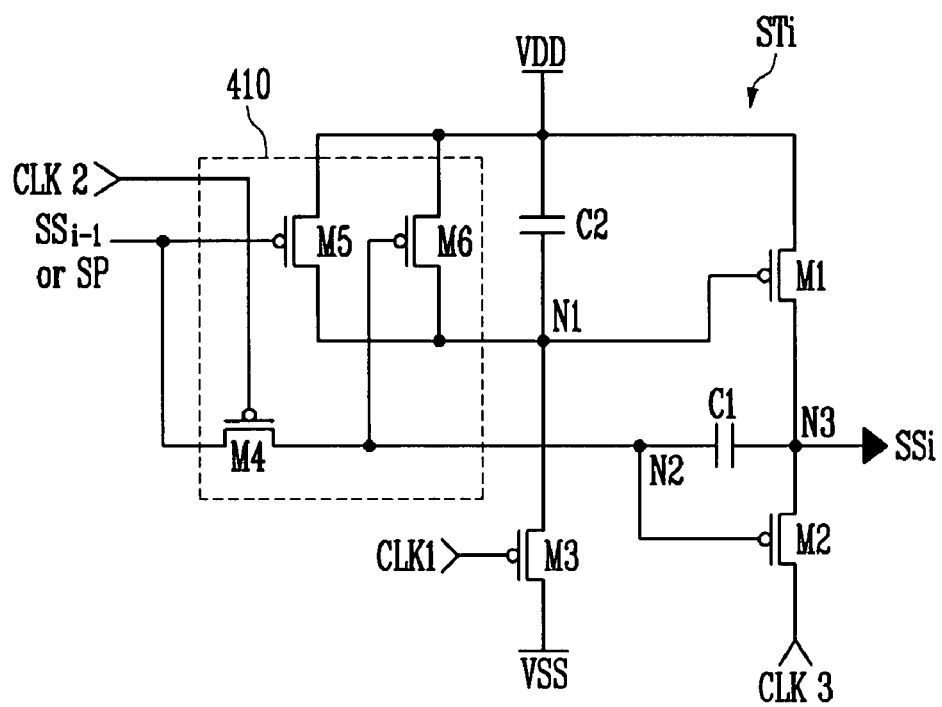
FIG. 4 illustrates a detailed circuit diagram of an example of a stage.

FIG. 4 illustrates a detailed circuit diagram of a stage ST1.

With reference to FIG. 4, the stage ST1 may include a voltage level controller 410, first to third transistors M1 to M3, and first and second capacitors C1 and C2.

The voltage level controller 410 may control voltage levels of a first node (first output node) N1 and second node (second output node) N2 at a high or low level according to the start pulse SP or an output signal SSi-1 of a previous stage and the second clock signal CLK2.

To do this, the voltage level controller 410 may include fourth to sixth transistors M4 to M6, which may be formed of a same conductivity type, e.g., P-type transistors.

The fourth transistor M4 may be coupled between an input line of the start pulse SP or an output signal SSi-1 of a previous stage and the second node N2. A gate electrode of the fourth transistor M4 may be coupled to an input line of the second clock signal CLK2. When the second clock signal CLK2 has a low level and is supplied to a gate electrode of the fourth transistor M4, the fourth transistor M4 is turned-on and supplies the start pulse SP or the output signal SSi-1 of a previous stage to the second node N2.

The fifth transistor M5 may be coupled between the first power supply VDD and the first node N1. A gate electrode of the fifth transistor M5 may be coupled to the input line of the start pulse SP or the output signal SSi-1 of a previous stage. When the start pulse SP or the output signal SSi-1 of a previous stage having a low level is input to a gate electrode of the fifth transistor M5, the fifth transistor M5 is turned-on and electrically connects the first node N1 to the first power supply VDD.

The sixth transistor M6 may be coupled between the first power supply VDD and the first node N1. A gate electrode of the sixth transistor M6 may be coupled to the second node N2. When a voltage level of the second node N2 drops to be equal to or less than a predetermined value, the sixth transistor M6 electrically connects the first node N1 to the first power supply VDD.

That is, the voltage level controller 410 may control a voltage level of the second node N2 according to the start pulse SP or the output signal SSi-1 of a previous stage. Further, the voltage level controller 410 may control a voltage level of the first node N1 according to the start pulse SP or the output signal SSi-1 of a previous stage and the voltage level of the second node N2.

The first transistor M1 may be coupled between the first power supply VDD, being a high level voltage source, and a third node (third output node) N3, being an output node of the stage ST1. A gate electrode of the first transistor M1 may be coupled to the first node N1. When a voltage level of the first node N1 is low (namely, when a voltage of the first node N1 is less than that of a source electrode of the first transistor M1), the first transistor M1 may be turned-on and electrically connect an output line of the stage ST1 to the first power supply VDD.

The second transistor M2 may be coupled between the third node N3 and an input line of the third clock signal CLK3. A gate electrode of the second transistor M2 may be coupled with the second node N2. When a voltage level of the second node N2 is low, the second transistor M2 is turned-on and electrically connects an output line of the stage ST1 to an input line of the third clock signal CLK3. That is, when the second transistor M2 is turned-on, a voltage level of the output signal SSi of the stage ST1 may become substantially identical to that of the third clock signal CLK3.

The third transistor M3 may be coupled between the first node N1 and a second power supply VSS, which may be a low level voltage source which is less than the first power supply VDD. A gate electrode of the third transistor M3 may be coupled to an input line of the first clock signal CLK1. When the first clock signal CLK1 of a low level is input to the input line of the first clock signal CLK1, the third transistor M3 is turned-on and electrically connects the first node N1 to the second power supply VSS.

The first, second, and third transistors M1, M2, and M3 having the constructions described above may all be of the same conductivity type, e.g., P-type transistors.

The first capacitor C1 may be coupled between the second node N2 and the third node N3. The first capacitor C1 may be charged with a predetermined voltage corresponding to a potential difference between both terminals thereof in order to stabilize an operation of the second transistor M2.

The second capacitor C2 may be coupled between the first power supply VDD and the first node N1. The second capacitor C2 may function to reduce a variation of a voltage, which may be applied to the first power supply VDD or the first node N1.

In the stage ST1 shown in FIG. 4, the first, second, and third clock signals CLK1, CLK2, and CLK3 are supplied to respective electrodes of the third, fourth, and second transistor M3, M4, and M2. However, in practice, the first, second, and third clock signals CLK1, CLK2, and CLK3 may be shifted by one clock pulse at every stage.

For example, in a stage following the stage ST1 shown in FIG. 4, the second, third, and first clock signals CLK2, CLK3, and CLK1, being shifted by one clock pulse, may be supplied to respective electrodes of the third, fourth, and second transistor M3, M4, and M2.

As is seen from the forgoing description, with this stage design, a shift register may be constructed using a relatively small number of components, namely, a relatively small in number of transistors M and capacitors C, thereby easily obtaining the shift register while reducing dead space.

Further, a manufacturing process may be simplified by designing the transistors M1 to M6 to be included in an optional stage ST1 with the same type of conductivity.

In an active matrix type organic light emitting flat panel display, a pixel array may include P-type transistors. When stages included in the shift register of a scan driver are constructed from transistors having the same conductive type as that of transistors included in the pixel array, the shift register may be formed simultaneously when the pixel array is formed on a substrate. Accordingly, a manufacturing process producing the flat panel display may be simplified in order to enhance efficiency by simultaneously forming the pixel array and the scan driver without increasing the number of processes.

That is, the shift register may be formed on the substrate together with the pixel array. However, the present invention is not limited thereto. For example, the shift register may be mounted in a chip and be mounted on a substrate on which the pixel array is formed.

Figure 5:
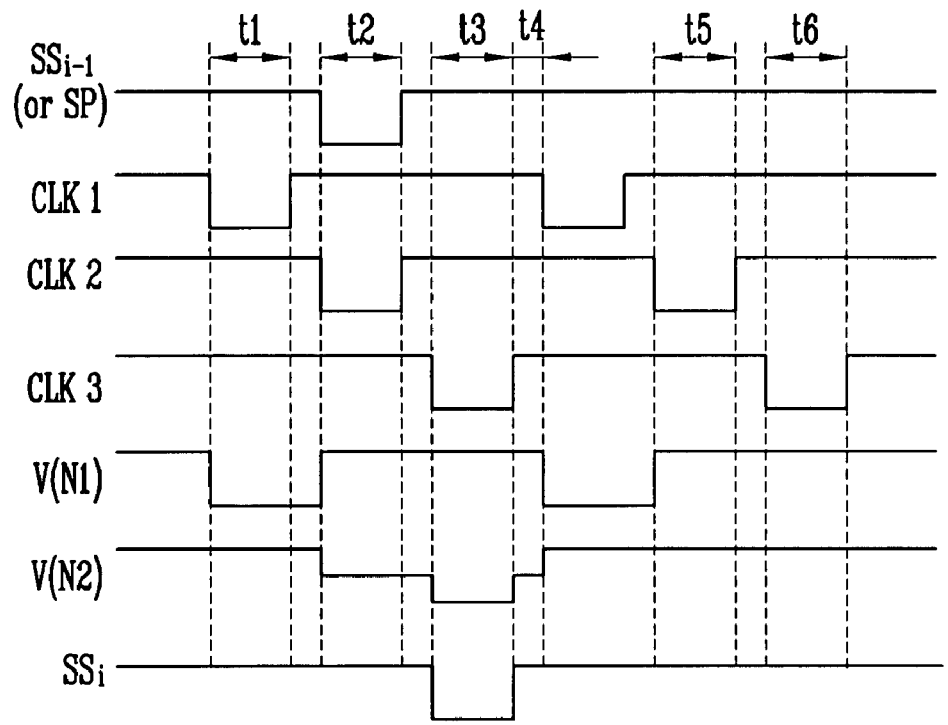
FIG. 5 illustrates an input/output signal waveform diagram of the stage shown in FIG. 4.

The following is a description of an operation of the stage shown in FIG. 4 with reference to the input/output signal waveform shown in FIG. 5. For convenience, factors such as a threshold voltage of a transistor will not be discussed.

Referring to FIG. 5, first, during a t1 period, an output signal SSi-1 (or start pulse SP) of a high level may be supplied to a source electrode of the fourth transistor M4 and a gate electrode of the fifth transistor M5.

Moreover, the first low level clock signal CLK1 may be supplied to a gate electrode of the third transistor M3, and the high level second clock signal CLK2 and the third high level clock signal CLK3 may be supplied to a gate electrode of the fourth transistor M4 and a drain electrode of the second transistor M2, respectively. Here, the first, second, and third clock signals CLK1, CLK2, and CLK3 have a waveform with a delayed phase.

Accordingly, the fourth and fifth transistor M4 and M5 maintain an off state, and the third transistor M3 is turned-on.

When the third transistor M3 is turned-on, a voltage of the second power supply VSS is transferred to the first node N1. During the t1 period, the first node N1 is charged with a low level voltage.

At this time, as the voltage of the first node N1 drops to a low level, the first transistor M1 is turned-on to supply the voltage of the first power supply VDD to an output line of the stage STi. Accordingly, the output signal SSi of the stage STi maintains a high level during the t1 period. The voltage charged in the second node N2 maintains a high level without variation.

Next, during a t2 period, a low level output signal SSi-1 (or start pulse SP) may be supplied to a source electrode of the fourth transistor M4 and a gate electrode of the fifth transistor M5.

Moreover, the first high level clock signal CLK1 may be supplied to a gate electrode of the third transistor M3, and the second low level clock signal CLK2 and the third high level clock signal CLK3 may be supplied to the gate electrode of the fourth transistor M4 and the drain electrode of the second transistor M2, respectively.

Accordingly, the fourth transistor M4 is turned-on according to the low level second clock signal CLK2, thus transferring a low level of the output signal SSi-1 (or start pulse SP) of a previous stage to the second node N2, in the event that the second node N2 is charged with the low level voltage.

In addition, as the fifth transistor M5 is turned-on according to the low level of the output signal SSi-1 (or start pulse SP) and the second node N2 is charged with the low level signal, the sixth transistor M6 is turned-on, thus charging the first node N1 with a high level voltage of the first power supply VDD.

Since the first node N1 is charged with the high level voltage, the first transistor M1 is turned-off. As the second node N2 is charged with the low level voltage, the second transistor M2 is turned-on, so that the high level third clock signal CLK3 is supplied to an output line of the stage ST1. At this time, a voltage capable of turning-on the second transistor M2 may be stored in the first capacitor C1.

Next, during a t3 period, a low level output signal SSi-1 of a previous stage (or start pulse SP) is supplied to the source electrode of the fourth transistor M4 and the gate electrode of the fifth transistor M5.

Furthermore, the first and second high level clock signals CLK1 and CLK2 of a high level may be respectively supplied to a gate electrode of the third transistor M3 and a gate electrode of the fourth transistor M4, and the low level third clock signal CLK3 may be provided to a drain electrode of the second transistor M2.

Accordingly, the third, fourth, and fifth transistors M3, M4, and M5 may be turned-off according to the high level output signal SSi-1 (or start pulse SP), and the high level first and second clock signals CLK1 and CLK2.

In addition, because the voltage capable of turning-on the second transistor M2 was stored in the first capacitor Cl during the previous t2 time period, the second transistor M2 may maintain an on state. Accordingly, a waveform in the output signal SSi of the stage ST1 may depend on that of the third clock signal CLK3. Namely, the output signal SSi of the stage ST1 may have a low level during the t3 period.

At this time, as the third clock signal CLK3 changes from a high level to a low level, through a coupling of the first capacitor C1 and the gate electrode of the second transistor M2, and the second node N2 is charged with a voltage level less than the low voltage level during the t2 period.

Accordingly, the sixth transistor M6 is turned-on, thus charging the first node N1 with a high level voltage.

Thereafter, during a t4 period, a high level output signal SSi-1 of the previous stage (or start pulse SP) may be supplied to the source electrode of the fourth transistor M4 and the gate electrode of the fifth transistor M5.

Furthermore, the first, second, and third high level clock signals CLK1, CLK2, and CLK3 may be respectively supplied to a gate electrode of the third transistor M3, a gate electrode of the fourth transistor M4, and a drain electrode of the second transistor M2.

Accordingly, the third, fourth, and fifth transistors M3, M4, and M5 maintain an off state according to the high level output signal SSi-1 of a previous stage (or start pulse SP), and the high level first and second clock signals CLK1 and CLK2.

In addition, the second transistor M2 maintains an off state via the first capacitor C1. Accordingly, the output signal SSi of the stage ST1 may have a high level according to a waveform of the third clock signal CLK3.

At this time, through a coupling of the first capacitor C1 and the gate of the second transistor M2, the second node N2 may be charged with a voltage level less than the low level during the t2 period. Accordingly, the sixth transistor M6 is turned-on, thus charging the first node N1 with an intermediate level voltage obtained by increasing the low level voltage during the t3 period by a predetermined value, which may be similar or identical with a value during the t2 period. Accordingly, the sixth transistor M6 maintains an on state, so that the first node N1 may maintain the high level voltage.

During following periods, since the output signal SSi-1 of the previous stage (or start pulse SP) may maintain a high level, the output signal SSi of the stage ST1 may also maintain the high level.

For example, during a t5 period, although the low level second clock signal CLK2 is supplied, because the output signal SSi-1 of the previous stage (or start pulse SP) supplied through the fourth transistor M4 continues to maintain a high level, the second node N2 is charged with a high level signal, with the result that a voltage capable of turning-off the second transistor M2 may be stored in the second node N2. Next, during a t6 period, although the low level third clock signal CLK3 is supplied, the second transistor M2 maintains an off state, so that the output signal SSi of the stage ST1 maintains a high level regardless of a level of the third clock signal CLK3.

In the aforementioned operations, stages ST1 of the shift register according to the present invention may delay the phase of the output signal SSi-1 of the previous stage (or start pulse SP) supplied thereto by one clock pulse in response to first to third clock signals CLK1 to CLK3, and outputs the phase-delayed signal to an output line.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A shift register including a plurality of stages, each stage comprising:
   first, second, and third output nodes;
   first, second, and third input lines adapted to supply first, second and third clock signals;
   a fourth input line adapted to supply a start pulse or an output signal of a previous stage;
   a voltage level controller coupled between the second and fourth input lines, the voltage level controller being adapted to control voltage levels of the first and second output nodes according to the second clock signal and the start pulse or the output signal of the previous stage;
   a first transistor coupled between a first power supply and the third output node, the third output node being an output node of the stage, the first transistor including a gate electrode coupled to the first output node;
   a second transistor coupled between the third output node and the third input line, the second transistor including a gate electrode coupled to the second output node; and
   a third transistor coupled between the first output node and a second power supply, the third transistor including a gate electrode coupled to the first input line,
   the voltage level controller including:
   a fourth transistor coupled between the fourth input line and the second output node, the fourth transistor including a gate electrode coupled to the second input line;
   a fifth transistor coupled between the first power supply and the first output node, the fifth transistor including a gate electrode coupled to the fourth input line; and
   a sixth transistor coupled between the first power supply and the first output node, the sixth transistor including a gate electrode coupled to the second output node, the gate electrode of the sixth transistor coupled to a different node than the gate electrode of the fifth transistor.

2. The shift register as claimed in claim 1, wherein the fourth, fifth, and sixth transistors are P-type transistors.

3. The shift register as claimed in claim 1, wherein the voltage level controller is adapted to control a voltage level of the second output node in accordance with the start pulse or an output signal of a previous stage and the second clock signal, and to control the voltage level of the first output node according to the start pulse or the output signal of the previous stage and a voltage level of the second output node.

4. The shift register as claimed in claim 1, wherein the first, second, and third transistors are P-type transistors.

5. The shift register as claimed in claim 1, wherein the first, second, and third clock signals have a waveform a phase of which is sequentially delayed.

6. The shift register as claimed in claim 1, further comprising a first capacitor coupled between the second output node and the third output node.

7. The shift register as claimed in claim 1, further comprising a second capacitor coupled between the first power supply and the first output node.

8. The shift register as claimed in claim 1, wherein the gate electrode of the fifth transistor is electrically connected to the fourth input line and the gate electrode of the sixth transistor is electrically connected to the second output node.

9. The shift register as claimed in claim 8, wherein the gate electrode of the fifth transistor is directly electrically connected to the fourth input line and the gate electrode of the sixth transistor is directly electrically connected to the second output node.

10. An organic light emitting display, comprising:
    a pixel portion including a plurality of pixels electrically coupled to scan lines and data lines;
    a scan driver including a shift register for sequentially applying a scan signal to the scan lines; and
    a data driver for applying a data signal to the data lines,
    wherein the shift register includes a plurality of stages coupled to a start pulse input line, each of the stages including:
    first, second, and third output nodes;
    first, second, and third input lines adapted to supply first, second and third clock signals;
    a fourth input line adapted to supply a start pulse or an output signal of a previous stage;
    a voltage level controller coupled between the second and fourth input lines, the voltage level controller being adapted to control voltage levels of the first and second output nodes according to the second clock signal and the start pulse or the output signal of the previous stage;
    a first transistor coupled between a first power supply and the third output node, the third output node being an output node of the stage, the first transistor including a gate electrode coupled to the first output node;
    a second transistor coupled between the third output node and the third input line, the second transistor including a gate electrode coupled to the second output node; and
    a third transistor coupled between the first output node and a second power supply, the third transistor including a gate electrode coupled to the first input line,
    the voltage level controller including:
    a fourth transistor coupled between the fourth input line and the second output node, the fourth transistor including a gate electrode coupled to the second input line;

a fifth transistor coupled between the first power supply and the first output node, the fifth transistor including a gate electrode coupled to the fourth input line; and a sixth transistor coupled between the first power supply and the first output node, the sixth transistor including a gate electrode coupled to the second output node, the gate electrode of the sixth transistor coupled to a different node than the gate electrode of the fifth transistor.

11. The organic light emitting display as claimed in claim 10, wherein the fourth, fifth, and sixth transistors are P-type transistors.

12. The organic light emitting display as claimed in claim 10, wherein the voltage level controller is adapted to control a voltage level of the second output node in accordance with the start pulse or an output signal of a previous stage and the second clock signal, and to control the voltage level of the first output node according to the start pulse or the output signal of the previous stage and a voltage level of the second output node.

13. The organic light emitting display as claimed in claim 10, wherein the first, second, and third transistors are P-type transistors.

14. The organic light emitting display as claimed in claim 10, wherein the first, second, and third clock signals each have a waveform a phase of which is sequentially delayed.

15. The organic light emitting display as claimed in claim 10, further comprising:

a first capacitor coupled between the second output node and the third output node.

16. The organic light emitting display as claimed in claim 10, further comprising:

a second capacitor coupled between the first power supply and the first output node.

17. The organic light emitting display as claimed in claim 10, wherein the gate electrode of the fifth transistor is electrically connected to the fourth input line and the gate electrode of the sixth transistor is electrically connected to the second output node.

18. The organic light emitting display as claimed in claim 17, wherein the gate electrode of the fifth transistor is directly electrically connected to the fourth input line and the gate electrode of the sixth transistor is directly electrically connected to the second output node.

\* \* \* \* \*

(12) SUPPLEMENTAL EXAMINATION CERTIFICATE

United States Patent
Jeong et al.

(10) Number: US 7,786,972 F1
(45) Certificate Issued: Jan. 21, 2016

Control No.: 96/000,119
Primary Examiner: Dennis Bonshock

Filing Date: Nov. 25, 2015

No substantial new question of patentability is raised in the request for supplemental examination. See the Reasons for Substantial New Question of Patentability Determination in the file of this proceeding.

(56) Items of Information

FOREIGN PATENT DOCUMENTS

| | | |
|---|---|---|
| KR | 10-2006-0052255 | 5/2006 |
| KR | 10-2005-0066945 | 6/2005 |